United States Patent
Singer et al.

(10) Patent No.: US 11,226,372 B2
(45) Date of Patent: Jan. 18, 2022

(54) PORTABLE CHIP TESTER WITH INTEGRATED FIELD PROGRAMMABLE GATE ARRAY

(71) Applicant: International Business Machines Corporation, Armonk, NY (US)

(72) Inventors: Noah Singer, White Plains, NY (US); Daniele Di Genova, Hopewell Junction, NY (US); Andrew Turner, Underhill, VT (US); John Torok, Poughkeepsie, NY (US); Gary Maier, Poughkeepsie, NY (US); Richard Oldrey, Clintondale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 168 days.

(21) Appl. No.: 16/597,002

(22) Filed: Oct. 9, 2019

(65) Prior Publication Data
US 2021/0109154 A1   Apr. 15, 2021

(51) Int. Cl.
*G01R 31/317* (2006.01)
*G01R 31/3177* (2006.01)

(52) U.S. Cl.
CPC ... *G01R 31/31718* (2013.01); *G01R 31/3177* (2013.01); *G01R 31/31713* (2013.01); *G01R 31/31721* (2013.01)

(58) Field of Classification Search
None
See application file for complete search history.

(56) References Cited

U.S. PATENT DOCUMENTS 6,889,348 B2 * 5/2005 Sato ................. G01R 31/31813
324/762.01
7,821,284 B2   10/2010 Chang et al.
(Continued)

FOREIGN PATENT DOCUMENTS

WO   2011149725 A2   12/2011

OTHER PUBLICATIONS

M. Zaghloul et al., "Implementation of FPGA for decision making in portable automatic testing systems for IC's library 8 digital circuits", ieeexplore.ieee.org. pp. 6. 2014.

*Primary Examiner* — Phung M Chung
(74) *Attorney, Agent, or Firm* — Cantor Colburn LLP; Tihon Poltavets

(57) ABSTRACT

Aspects of the invention include systems and methods directed to a portable chip tester. A non-limiting example of a system includes a housing, a printed circuit board mounted on the housing, in which the printed circuit board includes a first interface operable to permit electrical communication between the printed circuit board and a device under test. The system further includes a mount operable to enable an electrical connection with an integrated circuit, in which the integrated circuit is operable to manage testing the device under test under a testing protocol. The system further includes a power supply and a software platform that includes a memory having computer readable instructions and one or more processors for executing the computer readable instructions. The computer readable instructions controlling the processors to perform operations including directing the integrated circuit to manage testing of the device under test pursuant to the testing protocol.

19 Claims, 5 Drawing Sheets

(56) References Cited

U.S. PATENT DOCUMENTS

| | | | |
|---|---|---|---|
| 8,957,691 B2 | 2/2015 | Wang et al. | |
| 9,378,846 B2 | 6/2016 | Han | |
| 9,810,729 B2 | 11/2017 | Frediani | |
| 9,910,086 B2 | 3/2018 | Czamara et al. | |
| 10,139,449 B2 * | 11/2018 | Caradonna | G01R 31/31926 |
| 10,162,007 B2 * | 12/2018 | Chan | G01R 31/31907 |
| 10,397,158 B2 * | 8/2019 | Halahmi | H04L 51/08 |
| 2014/0125371 A1 | 5/2014 | Chung et al. | |

* cited by examiner ically pointed out and distinctly claimed in the claims
PORTABLE CHIP TESTER WITH INTEGRATED FIELD PROGRAMMABLE GATE ARRAY

BACKGROUND

The present invention generally relates to semiconductor device testing, and more specifically, to a portable chip tester with a field programmable gate array.

Testing semiconductor devices includes testing wafers and devices. Wafer testing is performed during the wafer manufacturing process, in which electrical characteristics of a wafer are tested before dicing the wafer into semiconductor dies or chips. Device testing performed in the final stages of the assembly and the testing process is conducted after packaging the diced semiconductor.

SUMMARY

Embodiments of the present invention are directed to a portable chip tester. A non-limiting example of a system includes a housing, a printed circuit board mounted on the housing, in which the printed circuit board includes a first interface operable to permit electrical communication between the printed circuit board and a device under test. The system further includes a mount operable to enable an electrical connection with an integrated circuit, in which the integrated circuit is operable to manage testing the device under test under a testing protocol. The system further includes a power supply and a software platform that includes a memory having computer readable instructions and one or more processors for executing the computer readable instructions. The computer readable instructions controlling the one or more processors to perform operations including directing the integrated circuit to manage testing of the device under test pursuant to the testing protocol.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
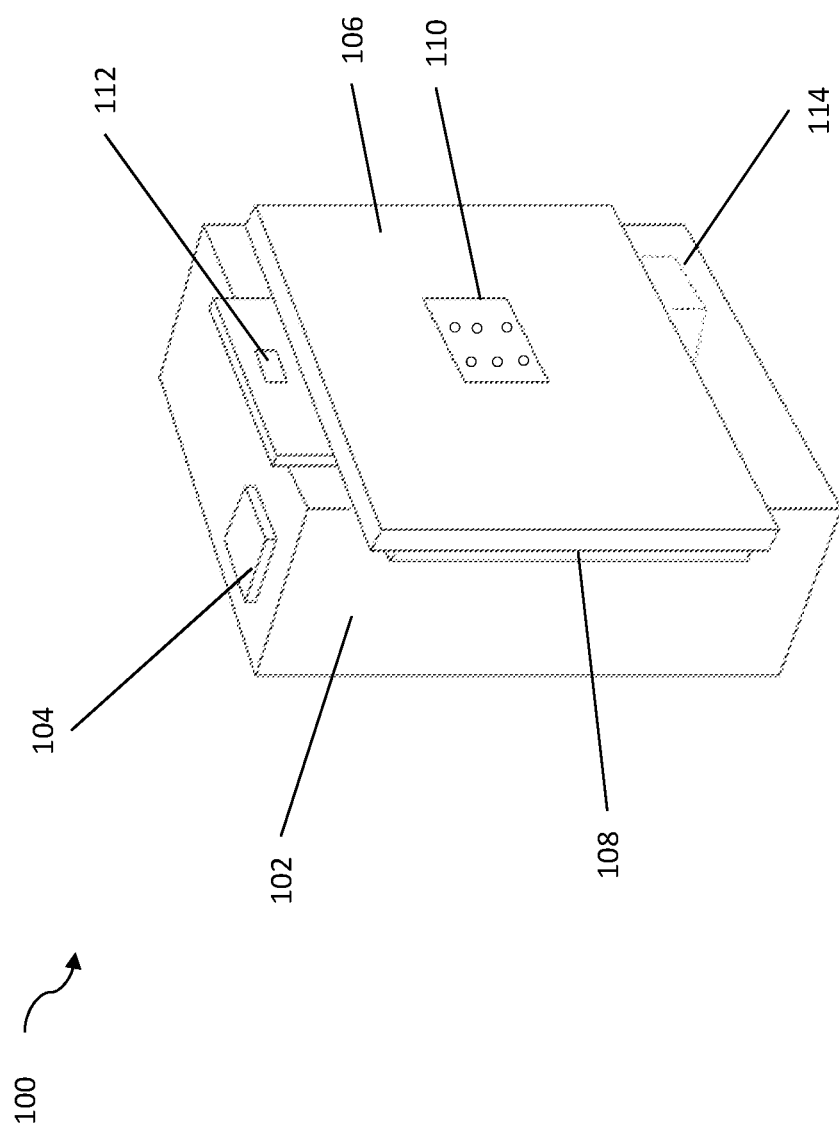
FIG. 1 illustrates a block diagram of components of a portable chip tester in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and does not imply a direct connection between the elements with no intervening elements/connections between them. All of these variations are considered a part of the specification.

DETAILED DESCRIPTION

One or more embodiments of the present invention provide a testing apparatus with an integrated field programmable gate array (FPGA). The FPGA permits the device testing apparatus to apply protocols to characterize a device under test (DUT), which improves testing efficiency. Furthermore, the device testing apparatus is portable, modular, and can interface with a nanoprobing device for testing wafers and a module handler for testing devices.

Engineers perform rigorous testing on semiconductor devices, such as processor chips, wafers, and modules for characterization and debugging. Device testing is typically performed with the use of automated test equipment (ATE), which are device specific, expensive, space consuming, and their applications are often limited to specific devices. Due to costs, companies are not willing to expend additional capital to replace older legacy ATEs. Furthermore, device development generally occurs faster than an ATE's development, causing the ATE's development cycle to be out of phase with a product's development cycle. Therefore, even if a company can afford to purchase a new ATE, an ATE may not be ready to test a new product.

Under conventional testing methods, engineers generate device-specific binary test patterns, which are then applied by the ATE to a device under test (DUT). The ATE records a signal response to each pattern, and an engineer reviews the responses to verify the device. The generation of these test patterns is time consuming, requires multiple steps, and involves a large amount of resources. Additionally, as patterns are device- and state-specific, an engineer has to generate a new pattern for each wafer, module, chip, and system. Furthermore, each time a change in a wafer, module, chip, or device is detected, a new pattern has to be generated. This results in a laborious, expensive, and lengthy testing process.

One or more embodiments of the present invention address one or more of the above-described shortcomings of the prior art by providing a lightweight, cost-efficient, modular testing apparatus operable to receive testing instructions in multiple high-level languages, convert the instructions into a device driver language, and transmit the instructions to an FPGA, which manages testing within the confines of the testing procedures. The testing apparatus can interface with various nanoprobing and module handler test devices to replace the bulky, costly, and static ATE.

The testing apparatus includes an FPGA, which manages device testing using testing protocols rather than the generated patterns. Unlike a fixed pattern, signal generation under a protocol is dynamic and adaptable to the DUT. Therefore, regardless of whether the DUT is a wafer or device, the protocol is operable for testing. Engineers no longer have to generate a new pattern for each instance of testing. This allows an engineer to instruct the apparatus to apply the same protocol across multiple test stages and devices.

Figure 2:
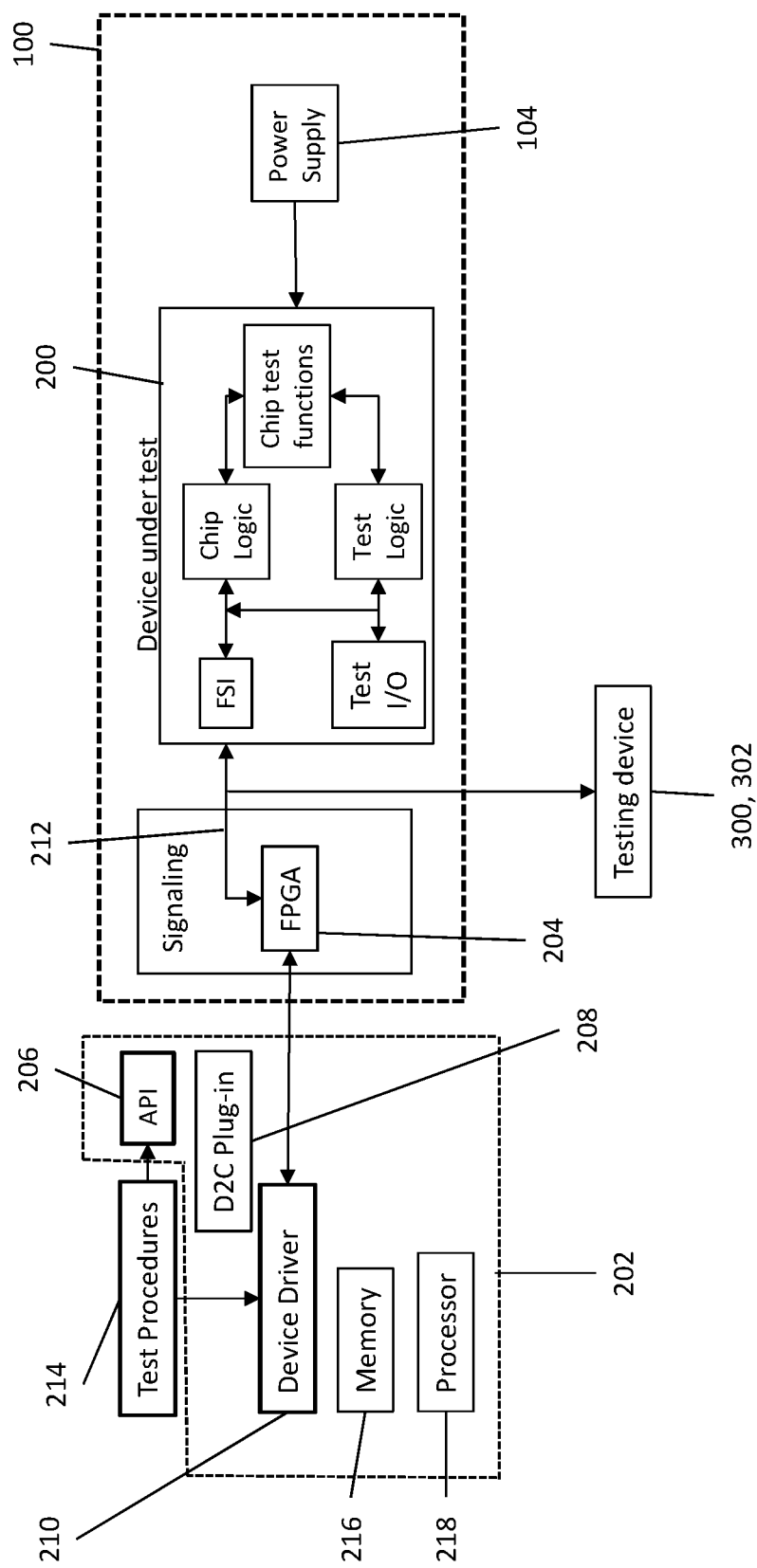
FIG. 2 illustrates a block diagram of components of a portable chip tester in accordance with one or more embodiments of the present invention.

Turning now to FIGS. 1 and 2, a testing apparatus 100 is generally shown in accordance with one or more embodiments of the present invention. The testing apparatus 100 includes a housing or a universal test box (UTB) 102. The UTB 102 has a rigid structure capable of maintaining its form under an external pressure exerted during a testing process. It should be appreciated that although FIG. 1. illustrates a rectangular-shaped UTB 102, the UTB 102 includes any structural configuration suitable to perform the embodiments described herein. A power supply 104 connected to the UTB 102 to supply power during the testing process. The power supply 104 includes a low cost, off-the-shelf power supply assembly. A direct interface board (DIB) 106 is mounted to a stiffener 108, which is mounted onto the UTB 102. The DIB 106 is a printed circuit board (PCB), and the interface between a device under test (DUT) 200 and a testing device, for example, a nanoprobing device 300 or a module handler 302. The stiffener 108 is made from a rigid material that provides structural support for the testing apparatus 100 to withstand external forces caused by a testing device.

The DIB 106 incorporates a socket 110 that receives the DUT 200. The LGA socket 110 is an electrical connection device that acts as an interface between the DUT 200 and the DIB 106. The DUT electrical contacts connect onto the contacts of the socket, which in turn connect to the DIB 106. This enables an electrical connection between the DUT 200 and the DIB 106 without the requirement of soldering the DUT 200 to the DIB 106. In some embodiments, the socket 110 is a land grid array (LGA) connector. As an alternate embodiment, a two-piece pin and socket interconnector may be used. The stiffener 108 includes an orifice (not shown) to permit wiring to pass through to enable electrical communication between the DUT 200 and a software platform 202.

Both the DIB 106 and the socket 110 are modular and can be replaced based on a DUT 200. For example, if the dimensions of the socket 110 are not suitable to house a DUT 200 or socket configuration does not comport to a particular DUT 200, the socket 110 can be replaced. The testing apparatus 100 further includes a cooling device 114 for regulating the testing apparatus 100 temperature. In some embodiments, a computer based service element (SE) (not shown) or controller (not shown) is provided and electrically coupled to the UTB to allow for an engineer to monitor testing.

An FPGA 204 is mounted to the UTB 102 at the mount 112. The FPGA 204 is an integrated circuit that configurable after manufacturing. The FPGA 204 is also a modular element of the testing apparatus 100 based on the DUT 200 and a desired testing protocol. An engineer can remove and replace the FPGA 204 or change its characteristics by replacing the software drivers. The FPGA 204 is pre-programmed with various protocols used for testing a DUT 200. The protocols include, but are not limited to, serial peripheral interface (SPI), Joint Testing Action Group (JTAG), Inter-Integrated Circuit ($I^2C$), and custom protocols. The FPGA 204 enables an engineer to perform a more dynamic testing of the DUT 200 than with traditional ATE pattern generation techniques. As an example, the conventional ATE pattern method involves continuously transmitting logical ones (1s) and zeros (0s) in a pattern based solely on a clock cycle and regardless of a signal response. On the other hand, an FPGA 204 can be programmed with a protocol that can wait for events or triggers from a DUT 200 and thereby generate more meaningful response signals.

Referring to FIG. 2, a diagram of the software platform 202 and the testing apparatus 100 are shown. The software platform 202 includes an application programming interface (API) 206, a direct to chip plug-in 208, and a device driver 210, a memory 216, and one or more processor 218. The API 206 and the direct to chip plug-in 208 provide a set of definitions and protocols to enable communication between the engineers and the FPGA 204. The API 206 and the direct to chip plug-in 208 are operable to receive a test procedure 214 in multiple high-level languages and translate the respective higher language to a device driver language. The device driver 210 is operable to direct an FPGA 204 to manage a testing process via the device driver language.

By using the API 206 and the direct to chip plug-in 208 to translate the testing procedures 204 into a device driver language, design engineers, packaging engineers testing engineers, and/or systems engineers can initiate testing procedures 204 in their respective preferred higher language, and operate the testing apparatus 100 to implement the desired test procedure 214.

The API 206 and the direct to chip plug-in 208 transmit the test procedure 214 in the device driver language. The device driver 210 converts the test procedure 214 to a command block of code, which includes a testing protocol to apply to the DUT 200. The device driver 210 transmits the command block to the FPGA 204. In response to receiving the command block, the FPGA 204 transmits instructions for executing the protocol to a wafer or device testing device 300, 302 by connecting with an I/O interface 212, for example, a bus. The protocol may call for using a slow I/O interface, for example, a narrow bus, a fast I/O, for example, a wide bus, a peripheral component interconnect express (PCIe) interface, or any other appropriate I/O interface 212. The FPGA 204 is operable to connect to a desired I/O interface to execute a protocol on a DUT 200.

Additionally, in a conventional testing procedure, standard testing cycles begin with a first stage of design testing stage, followed by a fabrication testing. The first stage is followed by a second stage, that includes circuit testing, system testing, and life testing. As described above, in each instance, any change to the device or stage causes the need for the generation of a new pattern. Furthermore, each testing stage is typically performed by different engineers who may be operating in their own respective software environments. This leads to duplication of efforts and increased testing times.

In a conventional ATE-based system, an engineer must take into consideration the unique configuration of the ATE and generate ATE specific patterns, that are time-based states of each pin or pin value per cycle. Each pattern is recorded, and the ATE essentially manages the recorded patterns to the DUT 200. However, as described above, any slight variation of a DUT, including changes to the DUT state or the DUT itself necessitates the need to generate a new set of patterns.

In the herein described systems and methods, the device driver 210 communicates to the FPGA 204 via a device driver language. Therefore, regardless of the software environment or language used to direct the testing procedures, the FPGA 204 is able to understand and implement the test procedure 214. Furthermore, using a protocol eliminates the necessity of using and consequently generating the recorded patterns of conventional ATEs. Furthermore, an engineer can use the same testing protocol to test an analytical model as well as a fabricated device.

The testing apparatus 100 is lightweight, portable, and can be applied within a number of testing environments. For example, referring to FIGS. 3A and 3B, the testing apparatus 100 is shown interfacing with a nanoprobing device 300 and a module handler 302, respectively. The nanoprobing device 300 is equipped with a probe card that includes an array of nanoprobes arranged in a pattern matching a pattern of a wafer. The nanoprobing device applies a pressure to press the nanoprobes into the wafer pattern to stimulate the wafer and measure the response. The nanoprobing device 300 applies a significant force and the top plate 304 adds rigidity and stability to the nanoprobing device 300. In turn, the stiffener 108 adds rigidity and stability to the testing apparatus 100. The module handler 302 is used to test a device. Similar to the nanoprobing device 300, the module handler 302 applies pressure to a probe card to press nanoprobes into patterns on the device.

Figure 3:
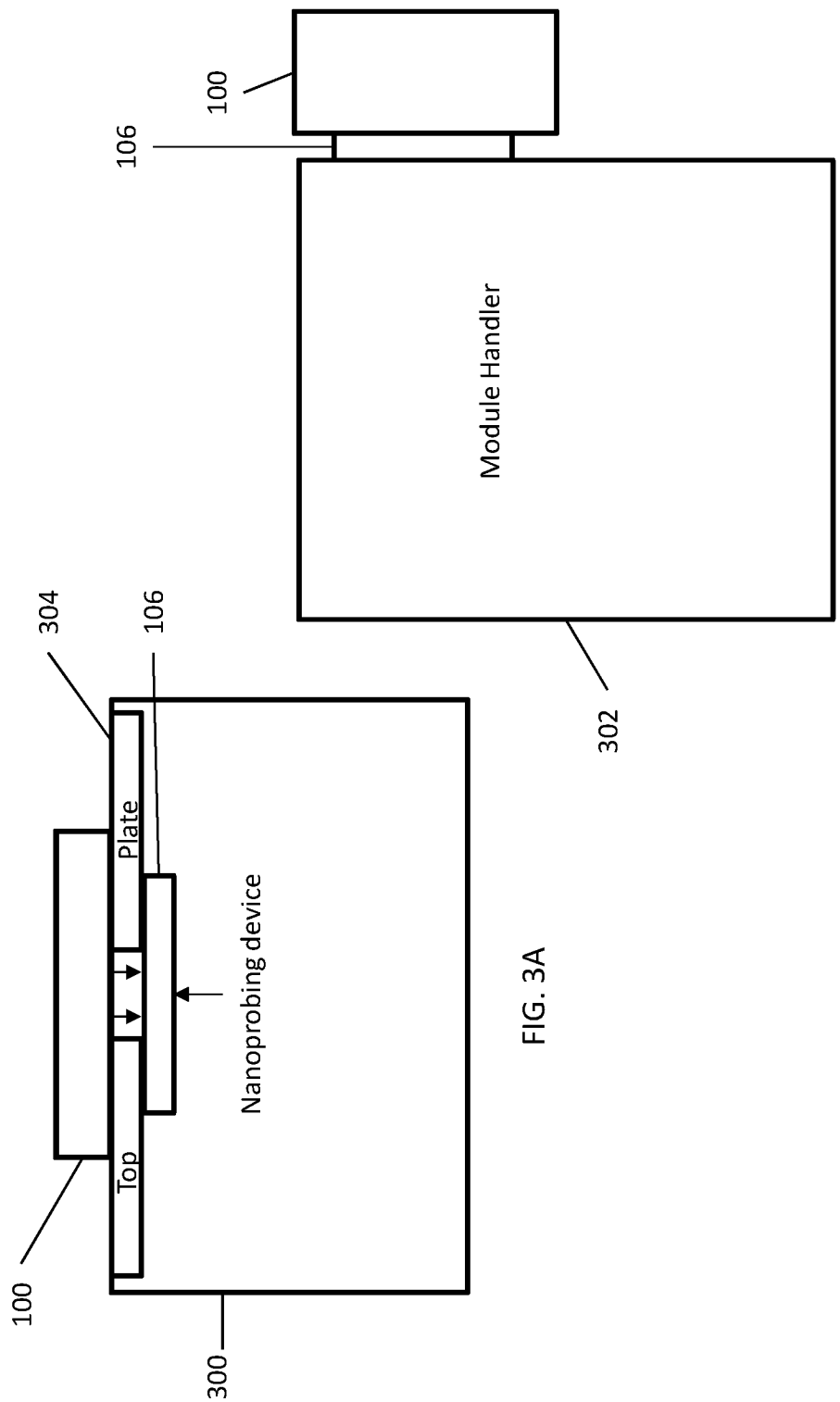
FIG. 3A illustrates a block diagram of a nanoprobing device in accordance with one or more embodiments of the present invention.
FIG. 3B illustrates a module handler in accordance with one or more embodiments of the present invention.

Using conventional methods, the nanoprobing device 300 and the module handler would be attached to a respective ATE. The ATE supplies the logic circuitry, signal patterns, and power to operate the nanoprobing device 300 and module handler 302. It should be noted that the ATE uses an ideal voltage source, which is a two-terminal device supplying any amount of current at a constant voltage. An ideal voltage source for an ATE requires space and is costly. However, as seen in FIGS. 1, 3A, and 3B, the testing apparatus 100 interfaces with the nanoprobing device 300 and the module handler replacing the necessity of an ATE and uses an off-the-shelf power supply 104, which greatly reduces cost.

Figure 4:
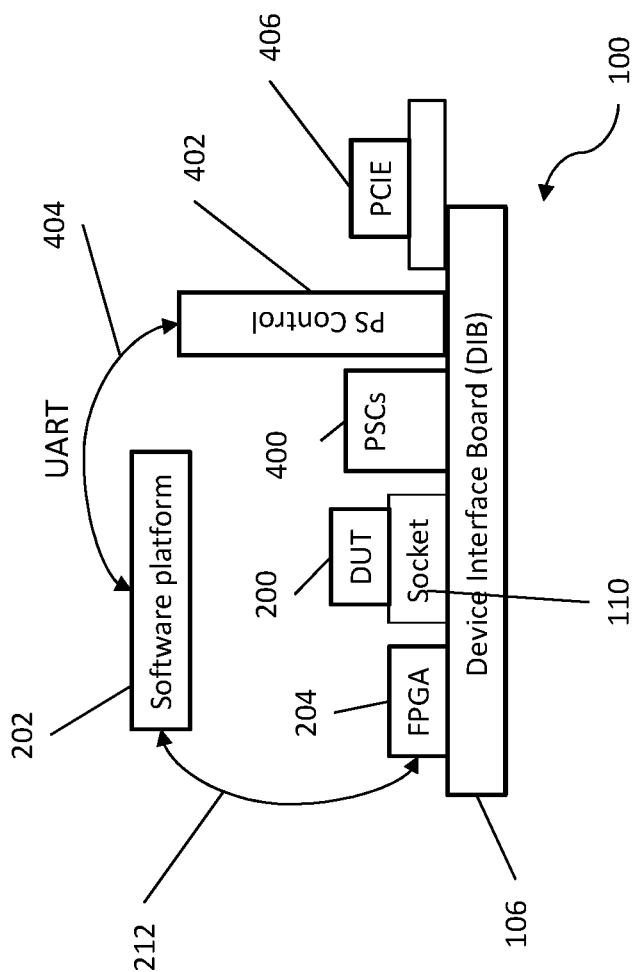
FIG. 4 illustrates a block diagram of components of a portable chip tester in accordance with one or more embodiments of the present invention.

Referring to FIG. 4, a block diagram of the testing apparatus 100 connected to the software platform 202 according to some embodiments of the present invention is shown. The DUT 200 and the FPGA 204 are mounted to the DIB 106. The FPGA 204 is connected to the software platform 202 via an I/O interface 212. The power supply 104 supplies power to the testing apparatus 100 and the software platform 202. The addition of a PCIe device 406 provides additional control of the DUT 200. The power is received at the DIB 106 through the power supply cards 400, that convert the supply power voltage and frequency, for example from a wall socket, to a power and voltage applicable to the DUT 200. The power supply control 402 regulates power to the various components of the testing apparatus 100 and software platform 202. The power supply control 402 regulates power to the software platform 202 via a connecting member 404, for example, a universal asynchronous receiver-transmitter (UART) 404.

Figure 5:
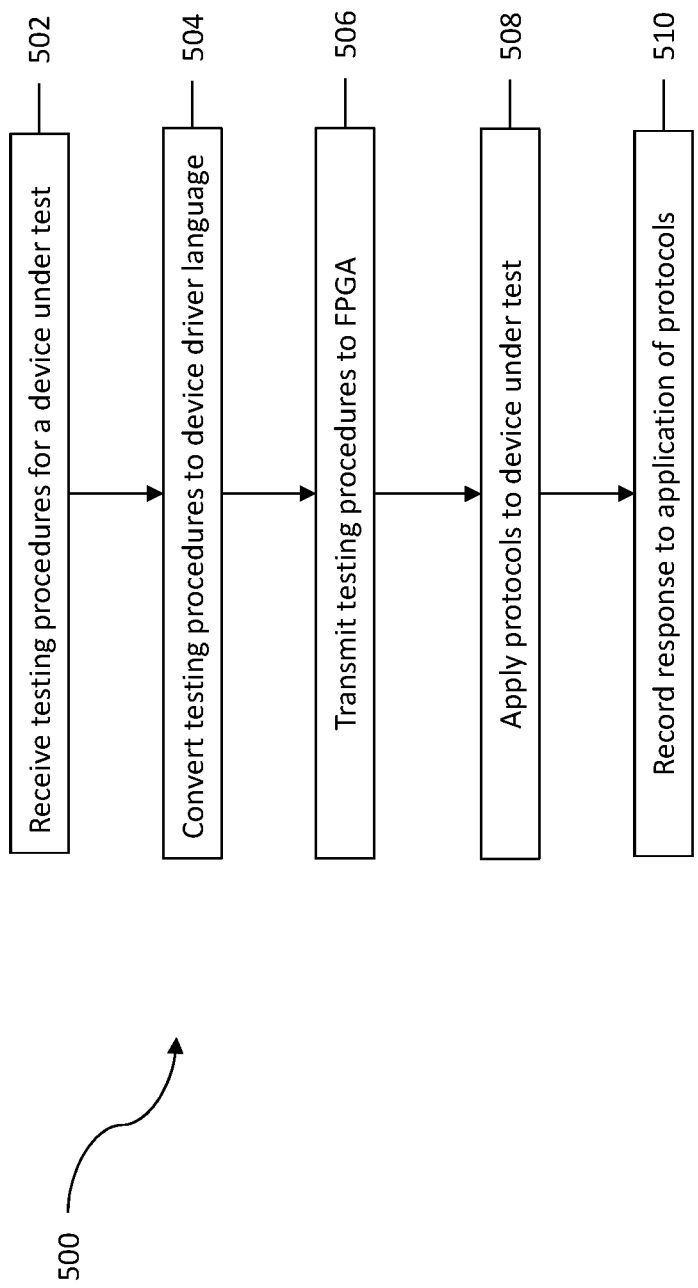
FIG. 5 illustrates a flow diagram of a process for testing in accordance with one or more embodiments of the present invention.

Referring to FIG. 5, a flow diagram of a process for testing is shown. At block 502, a software platform receives a testing procedure for a DUT. The testing procedure can be written in any applicable language and includes a desired testing protocol. At block 504, the testing procedure is converted into a language applicable to a device driver. At block 506, the testing procedure is transmitted from the device driver to an FPGA. The FPGA transmits the protocols to the testing device to test the DUT at block 508. At block 510 any signal response from the device under test is recorded.

Various embodiments of the invention are described herein with reference to the related drawings. Alternative embodiments of the invention can be devised without departing from the scope of this invention. Various connections and positional relationships (e.g., over, under, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system comprising:
    a housing;
    a printed circuit board mounted on the housing, wherein the printed circuit board comprises a first interface operable to permit electrical communication between the printed circuit board and a device under test;
    a mount operable to enable an electrical connection with an integrated circuit, wherein the integrated circuit is operable to manage testing the device under test under a testing protocol;
    a power supply; and
    a software platform comprising:
        a memory having computer readable instructions;
        one or more processors for executing the computer readable instructions, the computer readable instructions controlling the one or more processors to perform operations comprising:
            directing the integrated circuit to manage testing of the device under test pursuant to the testing protocol; and
    a stiffener arranged between the printed circuit board and the housing, wherein the stiffener comprises an orifice arranged to permit wiring to pass through to connect the device under test to the software platform, wherein the stiffener is further arranged to provide structural support for the housing from a force applied to the device under test.

2. The system of claim 1, wherein the integrated circuit is a field programmable gate array.

3. The system of claim 1, wherein the first interface is a socket.

4. The system of claim 3, wherein the socket is a land grid array or a two-piece pin and socket interconnector.

5. The system of claim 1 further comprising a power supply card for converting a voltage and a frequency of incoming power to conform to a voltage and a frequency required by the device under test.

6. The system of claim 1 further comprising a power supply control for regulating power to the printed circuit board and the one or more processors.

7. The system of claim 1 further comprising a second interface operable to enable electrical communication between the one or more processors and a nanoprobing device.

8. The system of claim 1 further comprising a second interface operable to enable electrical communication between the one or more processors and a module handler.

9. The system of claim 1, wherein the one or more processors further perform operations comprising:
    receiving a testing procedure in a first computer-based language; and
    translating the first computer-based language to a device driver language.

10. The system of claim 9, wherein the testing procedure includes the testing protocol.

11. The system of claim 10, wherein the testing protocol comprises a customized testing protocol.

12. A computer-implemented method comprising:
    receiving, by a software platform, a testing procedure in a computer-based language for testing a device, wherein the testing procedure includes a testing protocol;
    translating, by the software platform, the computer-based language into a device driver language;
    transmitting, by the software platform, the testing procedure to an integrated circuit of a testing apparatus; and
    directing, via the testing procedure, the integrated circuit to manage testing of the device using the testing protocol, wherein the testing protocol is stored on the integrated circuit,
    wherein the testing apparatus further comprises:
        a housing;
        a printed circuit board mounted on the housing, wherein the printed circuit board comprises a first interface operable to permit electrical communication between the printed circuit board and the device;
        a mount operable to enable an electrical connection with an integrated circuit; and
        a stiffener arranged between the printed circuit board and the housing, wherein the stiffener comprises an orifice arranged to permit wiring to pass through to connect the device to the software platform, wherein the stiffener is further arranged to provide structural support for the housing from a force applied to the device.

13. The computer-implemented method of claim 12, wherein the integrated circuit is a field programmable gate array.

14. The computer-implemented method of claim 12, wherein the integrated circuit communicates directly with the device under test.

15. The computer-implemented method of claim 12, wherein the testing protocol is a customized testing protocol.

16. The computer-implemented method of claim 12 further comprising:

applying a same testing protocol to test a wafer as a device comprising a portion of the wafer.

17. A computer program product comprising a computer readable storage medium having program instructions embodied therewith, the program instructions executable by a processor to cause the processor to perform operations comprising:

receiving a testing procedure in a computer-based language for testing a device, wherein the testing procedure includes a testing protocol;

translating the computer-based language into a device driver language;

transmitting the testing procedure to an integrated circuit of a testing apparatus; and directing, via the testing procedure, the integrated circuit to manage testing of the device using the testing protocol, wherein the testing protocol is stored on the integrated circuit, wherein the testing apparatus further comprises:

a housing;

a printed circuit board mounted on the housing, wherein the printed circuit board comprises a first interface operable to permit electrical communication between the printed circuit board and the device;

a mount operable to enable an electrical connection with an integrated circuit; and a stiffener arranged between the printed circuit board and the housing, wherein the stiffener comprises an orifice arranged to permit wiring to pass through to connect the device to the software platform, wherein the stiffener is further arranged to provide structural support for the housing from a force applied to the device.

18. The computer program product of claim 17, wherein the integrated circuit is a field programmable gate array.

19. The computer program product of claim 18, wherein the integrated circuit communicates directly with the device.

\* \* \* \* \*